(12) United States Patent
Tångring et al.

(10) Patent No.: US 9,685,584 B2
(45) Date of Patent: Jun. 20, 2017

(54) LIGHT EMITTING SEMICONDUCTOR COMPONENT INCLUDING AN ABSORPTIVE LAYER

(71) Applicant: OSRAM Opto Semiconductors GmbH, Regensburg (DE)

(72) Inventors: Ivar Tångring, Regensburg (DE); Petrus Sundgren, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/034,919

(22) PCT Filed: Nov. 13, 2014

(86) PCT No.: PCT/EP2014/074515
§ 371 (c)(1),
(2) Date: May 6, 2016

(87) PCT Pub. No.: WO2015/074950
PCT Pub. Date: May 28, 2015

(65) Prior Publication Data
US 2016/0284931 A1  Sep. 29, 2016

(30) Foreign Application Priority Data
Nov. 19, 2013 (DE) .......... 10 2013 112 740

(51) Int. Cl.
| | |
|---|---|
| H01L 33/04 | (2010.01) |
| H01L 33/02 | (2010.01) |
| H01L 33/30 | (2010.01) |
| H01L 33/44 | (2010.01) |
| H01L 33/36 | (2010.01) |
| H01L 33/58 | (2010.01) |

(Continued)

(52) U.S. Cl.
CPC .............. *H01L 33/04* (2013.01); *H01L 33/02* (2013.01); *H01L 33/30* (2013.01); *H01L 33/36* (2013.01); *H01L 33/44* (2013.01); *H01L 33/58* (2013.01); *H01L 33/60* (2013.01); *H01L 33/62* (2013.01); *H01L 33/06* (2013.01); *H01L 33/50* (2013.01)

(58) Field of Classification Search
CPC ...................................................... H01L 33/34
USPC ...................................................... 257/94, 98
See application file for complete search history.

(56) References Cited

U.S. PATENT DOCUMENTS

| | | | | |
|---|---|---|---|---|
| 2004/0211927 | A1* | 10/2004 | Schmidt .................. | H01J 61/40 250/504 R |
| 2006/0071232 | A1* | 4/2006 | Sasakura ................. | H01L 33/02 257/103 |

(Continued)

FOREIGN PATENT DOCUMENTS

| | | |
|---|---|---|
| DE | 100 56 476 A1 | 5/2002 |
| JP | 56-040287 A | 4/1981 |

(Continued)

*Primary Examiner* — George Fourson, III
(74) *Attorney, Agent, or Firm* — DLA Piper LLP (US)

(57) ABSTRACT

A radiation-emitting semiconductor device includes a semiconductor body with a semiconductor layer sequence, wherein the semiconductor layer sequence has an active region that generates radiation having a peak wavelength in the near-infrared spectral range and an absorptive region, and the absorption region at least partially absorbs a short-wave radiation component having a cut-off wavelength shorter than the peak wavelength.

13 Claims, 3 Drawing Sheets

(51) Int. Cl.
*H01L 33/60* (2010.01)
*H01L 33/62* (2010.01)
H01L 33/50 (2010.01)
H01L 33/06 (2010.01)

(56) References Cited

U.S. PATENT DOCUMENTS

| | | |
|---|---|---|
| 2006/0146903 A1 | 7/2006 | Sasakura et al. |
| 2007/0120129 A1 | 5/2007 | DenBaars et al. |
| 2008/0251794 A1 | 10/2008 | Koda et al. |
| 2010/0012959 A1* | 1/2010 | Wilm .................. H01L 33/50 257/98 |
| 2010/0314639 A1 | 12/2010 | Taniguchi et al. |

FOREIGN PATENT DOCUMENTS

| | | |
|---|---|---|
| JP | 08-130327 A | 5/1996 |
| JP | 2005-317823 A | 11/2005 |

* cited by examiner

LIGHT EMITTING SEMICONDUCTOR COMPONENT INCLUDING AN ABSORPTIVE LAYER

TECHNICAL FIELD

This disclosure relates to a radiation-emitting semiconductor device.

BACKGROUND

Radiation-emitting semiconductor devices such as, for example, light-emitting diodes that emit radiation in the infrared spectral range are desired for various applications. It has been found that devices emitting radiation in the near-infrared, for example, at an emission wavelength of 850 nm, may have shortwave radiation components that are still perceptible by the human eye. Such radiation components may be avoided by shifting the peak wavelength of the emitted radiation towards longer wavelengths. However, the sensitivity of conventional silicon detectors declines for wavelengths above 850 nm, thereby complicating detection of radiation of above this wavelength.

It could therefore be helpful to provide a semiconductor device that emits radiation straightforwardly detectable and at the same time not perceptible by the human eye.

SUMMARY

We provide a radiation-emitting semiconductor device including a semiconductor body with a semiconductor layer sequence, wherein the semiconductor layer sequence has an active region that generates radiation having a peak wavelength in the near-infrared spectral range and an absorption region, and the absorption region at least partially absorbs a shortwave radiation component having a cut-off wavelength shorter than the peak wavelength.

We also provide a radiation-emitting semiconductor device including a semiconductor body with a semiconductor layer sequence, wherein the semiconductor layer sequence has an active region that generates radiation having a peak wavelength in the near-infrared spectral range and an absorption region, the absorption region at least partially absorbs a shortwave radiation component having a cut-off wavelength which is shorter than the peak wavelength, the absorption region is nominally undoped, and the semiconductor device has a first contact and a second contact that externally electrically contact the semiconductor device and the absorption region is arranged outside a current path extending through the active region between the first contact and the second contact.

DETAILED DESCRIPTION

Figure 1:
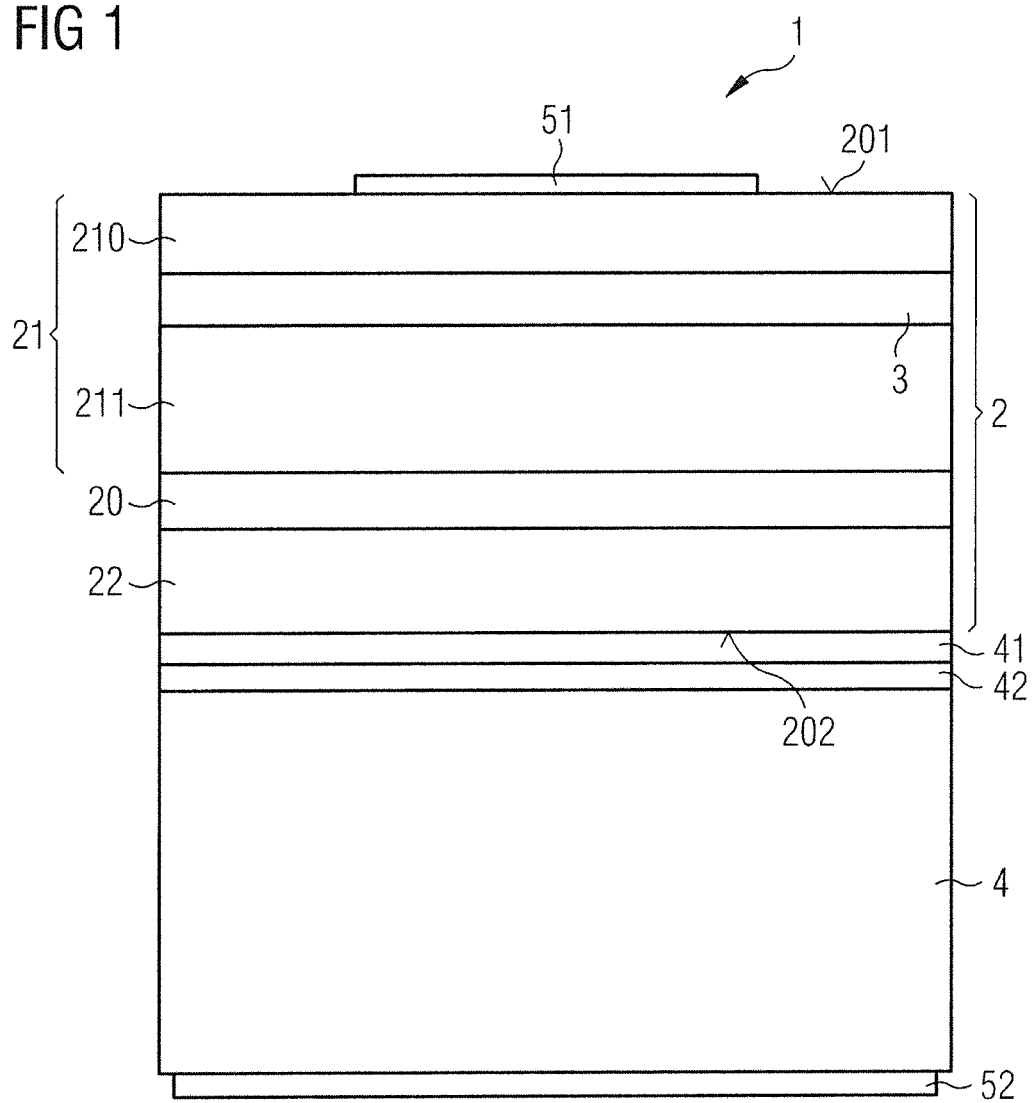
FIGS. 1 to 3 each show an example of a radiation-emitting semiconductor device in schematic sectional view.

Our semiconductor device may have a semiconductor body with a semiconductor layer sequence. The semiconductor layer sequence may comprise an active region that generates radiation, in particular generating radiation having a peak wavelength in the near-infrared spectral range. Should there be any doubt, the near-infrared spectral range is taken to mean a wavelength of 0.78 µm to 1.5 µm. The peak wavelength is preferably 830 nm to 920 nm, particularly preferably 830 nm to 860 nm.

In a vertical direction extending perpendicular to a main plane of extension of the semiconductor layer sequence of the semiconductor body, the semiconductor body extends, for example, between a radiation exit face and a back surface opposite the radiation exit face. The radiation-emitting semiconductor device has, for example, a carrier on which the semiconductor body is arranged.

For example, the semiconductor body has a first semiconductor region extending between the radiation exit face and the active region. The semiconductor body furthermore has, for example, a second semiconductor region extending between the active region and the back surface. The first semiconductor region and the second semiconductor region conveniently differ from one another regarding conduction type at least in the region adjacent the active region such that the active region is located in a pn junction.

For example, the first semiconductor region is at least in places n-conductive while the second semiconductor region is at least in places p-conductive or vice versa. The first semi-conductor region and the second semiconductor region in particular is free from an active region.

The semiconductor body may have an absorption region. The absorption region is thus part of the semiconductor body. In particular, only semiconductor material of the semiconductor body is present between the absorption region and the active region. The absorption region is in particular intended at least partially to absorb a shortwave radiation component having a cut-off wavelength shorter than the peak wavelength of the radiation emitted by the active region.

Radiation having a wavelength shorter than or equal to the cut-off wavelength is thus at least partially absorbed. The absorption region is conveniently configured such that the absorption coefficient for radiation having the peak wavelength amounts to at most 50%, preferably at most 20%, most preferably 10%, of the absorption coefficient for radiation having the cut-off wavelength.

The cut-off wavelength and the peak wavelength are, for example, at least 20 nm and at most 100 nm apart from one another.

The semiconductor device may have a semiconductor body with a semiconductor layer sequence, wherein the semiconductor layer sequence has an active region that generates radiation having a peak wavelength in the near-infrared spectral range and an absorption region, wherein the absorption region at least partially absorbs a shortwave radiation component having a cut-off wavelength shorter than the peak wavelength.

The radiation-emitting semiconductor device thus has an absorption region integrated into the semiconductor body, which absorption region at least partially absorbs a shortwave radiation component, which component is in particular visible to the human eye. The absorption region thus suppresses an undesired radiation component in the visible spectral range at least to such an extent that the component is no longer perceptible by the human eye. By such an absorption region, even at a peak wavelength comparatively close to the perceptual threshold of the human eye, for example, a peak wavelength of 850 nm, shortwave radiation components may be prevented from being perceived by the human eye. The radiation-emitting semiconductor device can thus provide radiation comparatively straightforwardly detectable, for example, by a conventional silicon detector without troublesome radiation components occurring in the visible spectral range. Filter elements or filter layers applied outside the semiconductor body that suppress such visible spectral components may be dispensed with. In particular, the absorption region may be formed as early as during, for example, epitaxial deposition of the semiconductor layers of the semiconductor body.

The absorption region may have an absorption coefficient for radiation having the cut-off wavelength of at least 5,000/cm, preferably of at least 10,000/cm. At an absorption coefficient of 10,000/cm, a layer having a thickness of 100 nm, for example, extinguishes 10% of the incident radiation on single perpendicular passage. Due to the comparatively high refractive index of semiconductor material, the radiation generated in the active region typically passes repeatedly through the semiconductor body and, hence, also the absorption region before the radiation exits from the semiconductor body. An absorption region integrated into the semiconductor body is thus capable even at a very small thickness of, for example, 100 nm of efficiently absorbing the undesired radiation components in the visible spectral range without significantly impairing the radiation having the peak wavelength.

The cut-off wavelength may be less than or equal to 820 nm. The longer the cut-off wavelength, the lower the risk of the human eye being able to perceive shortwave radiation components of the radiation emitted by the active region.

The absorption region may have at least one layer, the doping concentration of which is at most half the level of a doping concentration of a semiconductor material arranged between the absorption region and the active region. The lower the doping concentration, the steeper can the absorption edge be, i.e., the transition between the wavelength range in which radiation is absorbed and the wavelength range in which radiation is transmitted.

The absorption region may be nominally undoped. Such an absorption region may be distinguished by a particularly steep absorption edge.

The semiconductor device may have a first contact and a second contact for external electrical contacting of the semiconductor device. For example, the first contact electrically contacts the first semiconductor region and the second contact electrically contacts the second semiconductor region such that charge carriers can be injected through the first semiconductor region or second semiconductor region from different sides into the active region and there recombine with emission of radiation.

The absorption region may be arranged outside a current path extending through the active region between the first contact and the second contact. In other words, charge carrier injection bypasses the absorption region. The absorption region itself may therefore also have a comparatively low electrical conductivity and, for example, be nominally undoped.

For example, the absorption region has at least one cutout in which a semiconductor layer arranged between the absorption region and the active region is adjacent the first contact or the second contact. The absorption region thus only in places covers the semiconductor layer arranged between the active region and the absorption region. For example, the cutout may surround the absorption region in the manner of a frame. Alternatively or in addition, the absorption region may have a cutout surrounded in the lateral direction around the entire circumference of the cutout by material of the absorption region.

The absorption region may be arranged in a current path extending through the active region between the first contact and the second contact. In operation, at least one charge carrier type is thus injected through the absorption region into the active region. In this case, the absorption region is conveniently of electrically conductive construction. In particular, the absorption region has the same conduction type as the semiconductor material adjacent the absorption region.

The semiconductor body, in particular the active region, may be based on an arsenide compound semiconductor material.

"Based on an arsenide compound semiconductor" means that the active layer or at least one layer thereof comprises an arsenic III-V compound semiconductor material, preferably $Al_nGa_mIn_{1-n-m}As$, wherein $0 \le n \le 1$, $0 \le m \le 1$ and $n+m \le 1$. This material need not necessarily have a mathematically exact composition according to the above formula. Instead, it may comprise one or more dopants and additional constituents which do not substantially modify the characteristic physical properties of the $Al_nGa_mIn_{1-n-m}As$ material. For simplicity's sake, however, the above formula includes only the fundamental constituents of the crystal lattice (Al, Ga, In, As), even if these may in part be replaced by small quantities of further substances.

Using this material system, radiation having a peak wavelength in the near-infrared spectral range may be straightforwardly and reliably generated with high quantum efficiency.

The absorption region may be based on an arsenide compound semiconductor material. For example, the absorption region contains $Al_xGa_{1-x}As$ with $0.01 \le x \le 0.1$.

The higher the aluminum content, the larger the band gap and, consequently, the shorter the cut-off wavelength of the absorbed radiation corresponding to the band gap. In particular, the absorption region has an Al content of 0.03 to 0.07. At an aluminum content of 0.07, the band gap amounts to approximately 1.51 eV, which corresponds to a cut-off wavelength of 820 nm.

The absorption region may have a quantum structure with at least one quantum layer.

The term "quantum structure" includes in particular any structure in which charge carriers may undergo quantization of their energy states by inclusion ("confinement"). In particular, the term quantum structure does not provide any indication of the dimensionality of the quantization. It thus encompasses inter alia quantum wells, quantum wires and quantum dots and any combination of these structures.

Charge carrier pairs generated by radiation absorption in the absorption region can be captured by the quantum structure and, in the quantum layer, emit radiation having a peak wavelength shorter than the wavelength of the absorbed radiation. This reduces the risk of electron-hole pairs generated in the active region by radiation absorption recombining in the active region and resulting in emission of radiation in the visible spectral range.

The absorption region may be arranged between the active region and the radiation exit face of the semiconductor body. Radiation generated in the active region must therefore pass through the absorption region at least once before it can impinge on the radiation exit face of the semiconductor body.

The semiconductor device may take the form of a thin-film semiconductor chip in which the semiconductor body is fastened by a materially bonded connection to a carrier and is remote from a growth substrate for the semiconductor layer sequence of the semiconductor body. For example, a particular metallic mirror layer is arranged between the carrier and the semiconductor body. The mirror layer conveniently has high reflectivity for the radiation generated in the active region, for example, a reflectivity of at least 60% for the radiation having the peak wavelength. Gold, for example, is distinguished by high reflectivity in the infrared spectral range. In a thin-film semiconductor chip, the radiation component exiting from the sides is reduced in favor of an increased radiation component passing through the radiation exit face.

Further features, configurations and convenient aspects are revealed by the following description of the examples in conjunction with the figures. Identical, similar or identically acting elements are provided with the same reference numerals in the figures.

The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

FIG. 1 shows a first examples of a radiation-emitting semiconductor device. The semiconductor device 1 comprises a semiconductor body with a semiconductor layer sequence 2. The semiconductor body 2 extends in a vertical direction extending perpendicular to a main plane of extension of the semiconductor layers of the semiconductor body between a radiation exit face 201 and a back surface 202 opposite the radiation exit face. Between the radiation exit face and the back surface, the semiconductor body solely comprises semiconductor material, in particular epitaxially deposited semiconductor material of the semiconductor layer sequence.

The semiconductor body 2 furthermore comprises an active region 20 that generates radiation in the near-infrared. The active region 20 is preferably intended to generate radiation having a peak wavelength of 830 nm to 920 nm, particularly preferably 830 nm to 870 nm, for example, 850 nm. For example, the active region 20 contains a multiple quantum well structure (MQW) based on an arsenide compound semiconductor material.

A first semiconductor region 21 extends between the active region 20 and the radiation exit face 201. A second semiconductor region 22 extends between the active region 20 and the back surface 202. The first semiconductor region and the second semiconductor region differ from on another regarding conduction type at least on the side adjacent the active region 20 such that the active region 20 is located in a pn junction. The semiconductor body with the semiconductor layer sequence 2 furthermore comprises an absorption region 3. In the example shown, the absorption region 3 is formed in the first semiconductor region 21. The absorption region is thus arranged between the front surface and the active region 20.

The absorption region 3 is intended at least partially to absorb a shortwave radiation component of the radiation generated by the active region, namely radiation having a shorter wavelength than a cut-off wavelength. The absorption region 3 thus defines the shortwave flank of the emission spectrum of the semiconductor device 1.

The cut-off wavelength is preferably 800 nm to 820 nm. The cut-off wavelength is preferably at least 20 nm, particularly preferably at least 30 nm shorter than the peak wavelength of the radiation generated in the active region 20. The greater the difference between the cut-off wavelength and the peak wavelength, the lower the risk of a per se desired radiation component also being absorbed by the absorption region 3.

The semiconductor device furthermore comprises a first contact 51 for external electrical contacting of the first semiconductor region 21 and a second contact for external electrical contacting of the second semiconductor region 22.

The absorption region 3 is arranged between a connection layer 210 of the first semiconductor region 21 and a semiconductor layer 211 of the first semiconductor region.

The connection layer 210 is highly doped, for example, with a doping concentration of at least $1 \times 10^{18}$ cm$^{-3}$.

Production of an ohmic contact to the first contact 51 is simplified as a consequence.

The absorption region 3 preferably has a lower doping concentration than the connection layer 210 and the semiconductor layer 211. The doping concentration of the absorption region is preferably at most half the level of the doping concentration of the connection layer. The doping concentration of the absorption region particularly preferably amounts to at most 20%, most preferably at most 10% of the doping concentration of the connection layer. The lower the doping concentration, the steeper the absorption edge in the region of the cut-off wavelength.

The absorption region 3 is located in an electrical current path between the first contact 51 and the second contact 52, which each electrically contact the semiconductor device 1. The absorption region located in the current path is conveniently doped with the same charge type as the adjacent semiconductor material, for example, the semiconductor material of the first semiconductor region 21. The doping concentration of the absorption region 3 is therefore in particular of a level such that the electrical resistance of the absorption region does not impede charge carrier injection into the active region 20.

The semiconductor device 1 takes the form of a semiconductor chip, in particular of a thin-film semiconductor chip. The semiconductor body with the semiconductor layer sequence 2 is arranged on a carrier 4 other than a growth substrate and is mechanically and in particular also electrically conductively connected by a bonding layer 42.

A mirror layer 41 is arranged between the semiconductor body with the semiconductor layer sequence 2 and the carrier 4, which mirror layer deflects radiation emitted towards the carrier 4 in the direction of the radiation exit face 201. In a thin-film semiconductor chip, the radiation exit face remote from the carrier forms a main radiation exit face through which at least 50% of the radiation generated in operation exits. The absorption region 3 is located between the radiation exit face 201 and the active region 20 such that the radiation must pass at least once through the absorption region 3 before it can exit from the radiation exit face 201.

Due to the comparatively high refractive index of an arsenide compound semiconductor material, the jump in refractive index at the radiation exit face 201 to the surroundings, for example, air or an adjacent encapsulation material, is so large that a considerable radiation component is totally reflected at the radiation exit face 201 and consequently passes repeatedly through the absorption region 3, before the radiation exits from the semiconductor device 1. As a consequence, overall strong attenuation of the shortwave radiation component is achieved even with a comparatively thin absorption region 3. For example, AlGaAs has an absorption coefficient of approximately 10,000/cm for radiation corresponding to the wavelength of the band gap. Consequently, even with an absorption region thickness of 100 nm region with radiation passing through perpendicularly, at least 10% of the radiation impinging on the absorption region is absorbed. The thickness of the absorption region may, of course, also be other than 100 nm. The thickness of the absorption region is, for example, 50 nm to 500 nm.

The absorption region 3 contains a III compound semiconductor material, in particular an arsenide compound semiconductor material, configured with regard to band gap such that the cut-off wavelength corresponds to the band gap. For example, $Al_{0.07}Ga_{0.93}As$ has a band gap which corresponds to a wavelength of 820 nm. Radiation having a wavelength shorter than 820 nm is thus efficiently absorbed, while radiation having a longer wavelength is transmitted.

The aluminum content at least in one layer of the absorption region preferably amounts to 0.03 to 0.07.

With the absorption region integrated into the semiconductor body, it is thus possible to ensure as early as during epitaxial deposition of the semiconductor layer sequence for the semiconductor body that even a semiconductor device with a comparatively short wavelength in the near-infrared, for example, with a wavelength of 850 nm, does not emit any radiation or at least only a considerably reduced radiation component in the visible spectral range.

Additional filter elements downstream of the semiconductor device that suppress the shortwave radiation component may be dispensed with. Furthermore, the peak wavelength need not be shifted to longer wavelengths, for example, wavelengths of above 900 nm such that the radiation having the peak wavelength may be efficiently received with conventional silicon detectors.

An absorption region 3 integrated into the semiconductor chip, in particular into the semiconductor body, is of course also suitable for semiconductor chips that do not take the form of thin-film semiconductor chips. In this case, the carrier 4 may be the growth substrate. A bonding layer between the carrier and the semiconductor body with the semiconductor layer sequence 2 is not necessary. The mirror layer 41 may be omitted or be formed by a Bragg reflector integrated into the semiconductor body 2.

The arrangement of the first contact 51 and the second contact 52 may also be selected within broad limits providing that, by application of an electrical voltage between the contacts, charge carriers can be injected from different sides into the active region 20 and there recombine with emission of radiation.

Figure 2:
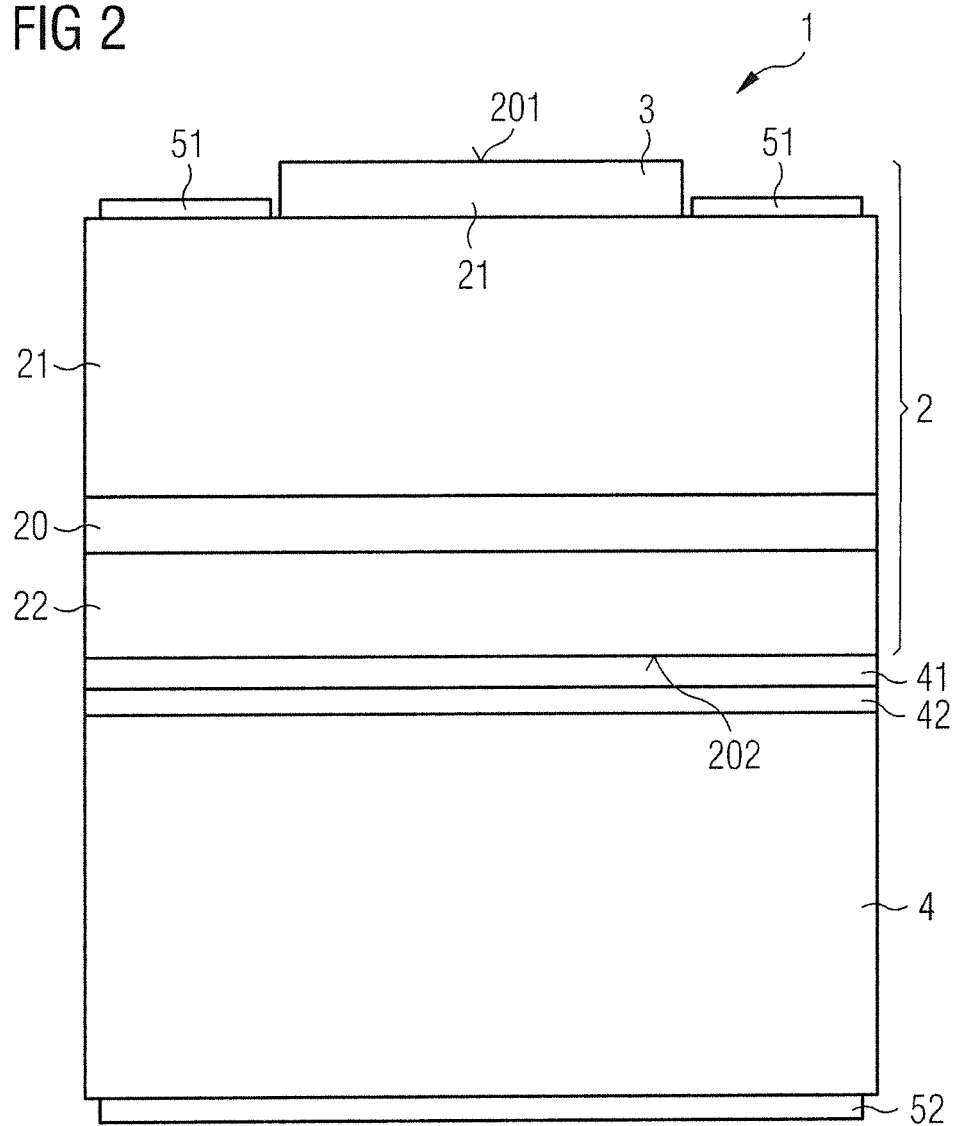

The second example, illustrated in FIG. 2, of a semiconductor device substantially corresponds to the first example described in connection with FIG. 1. At variance therewith, the absorption region 3 is arranged outside a current path extending through the active region 20 between the first contact 51 and the second contact 52. In this case, the absorption region 3 may thus be formed independently of the electrical properties thereof and in particular also be nominally undoped or at least only weakly doped, for example, with a doping concentration of at most $1\times10^{16}$ $cm^{-3}$. A particularly steep absorption edge in the region of the cut-off wavelength may consequently be achieved in simplified manner.

In the example shown, the absorption region 3 forms the radiation exit face 201. The first semiconductor region 21 is arranged between the absorption region 3 and the active region 20. The first semiconductor region 21 is accessible by a cutout 35 in the absorption region 3 for the first contact 51. The cutout is a cutout extending in the shape of a frame or ring around the absorption region 3. In contrast thereto, the cutout may however also be surrounded in the lateral direction around the entire circumference by material of the absorption region 3 and, for example, be arranged in plan view centrally on the semiconductor device 1.

The second example indeed entails an additional production step compared to the first example to expose regions of the first semiconductor region 21, for instance by wet chemical or dry chemical etching. Since, however, the absorption region 3 is located outside the current path, the absorption region may also be formed with undoped or at least only slightly doped semiconductor material and/or with a comparatively large thickness without impairing the electrical properties of the semiconductor device. A particularly steep absorption edge may be formed by a slightly doped absorption region 3 of this kind such that, on the one hand, radiation having the peak wavelength is not absorbed and, on the other hand, radiation that might be perceived by the human eye is highly efficiently absorbed.

Figure 3:
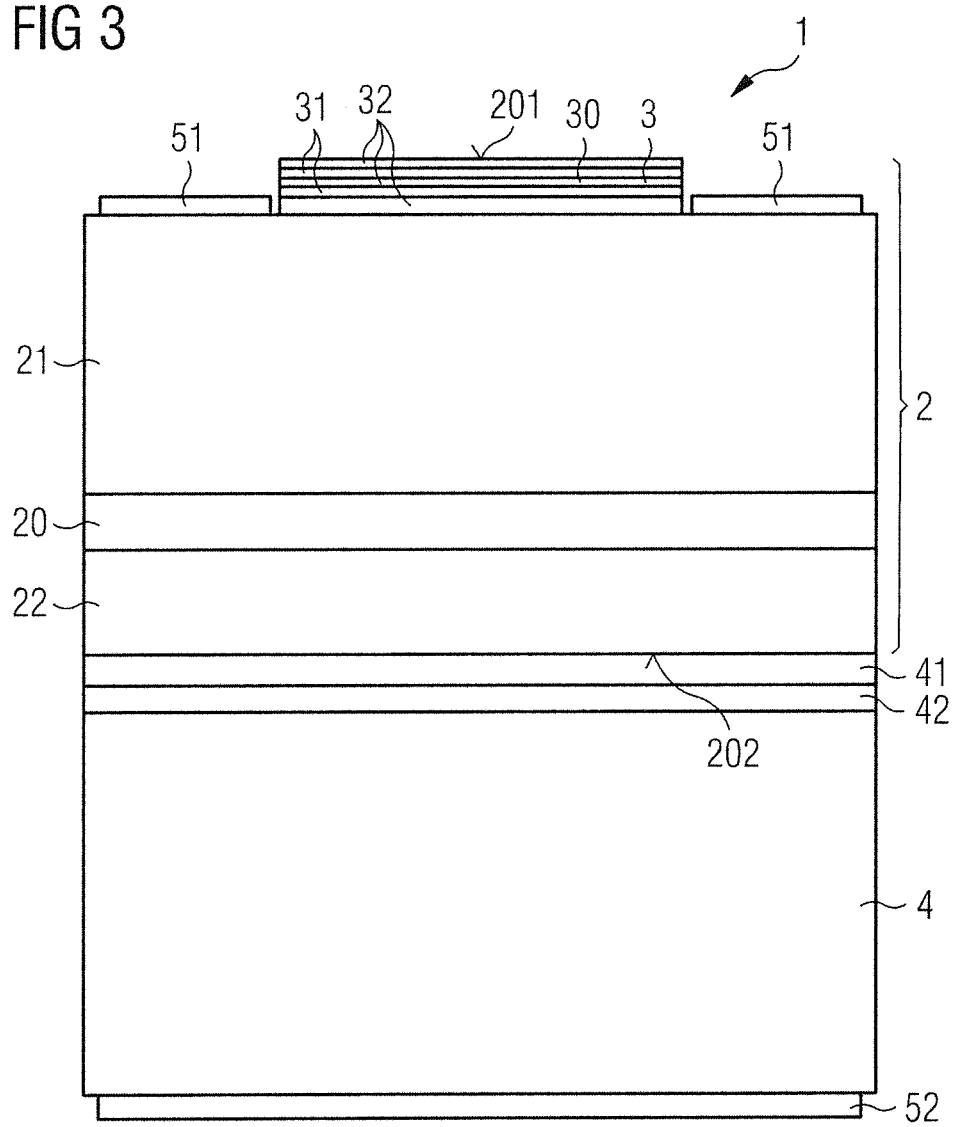

The third example, illustrated in FIG. 3, substantially corresponds to the second example described in connection with FIG. 2. At variance therewith, the absorption region 3 has a quantum structure 30. By way of example, the quantum structure has two quantum layers 31 arranged between barrier layers 32. The number of quantum layers may, however, be varied within broad limits and may, for example, be 1 to 30. Electron-hole pairs generated by absorption in the absorption region 3 of the radiation generated by the active region 20 in operation can be captured in the quantum layers 31 and there recombine with emission of radiation. The radiation re-emitted in this manner has a longer wavelength than the radiation absorbed in the absorption region 3, in particular in the barrier layers 32 of the absorption region 3 such that the radiation component is not perceptible to the human eye and consequently not troublesome even if it exits from the semiconductor device 1.

Such a quantum structure 30 may, of course, also be used in the absorption region 3 in the first example described in connection with FIG. 1.

This application claims priority of DE 10 2013 112 740.1, the subject matter of which is included by reference.

Our components are not restricted by the description given with reference to the examples. Rather, this disclosure encompasses any novel feature and any combination of features, including in particular any combination of features in the appended claims, even if the feature or combination is not itself explicitly indicated in the claims or the examples.

The invention claimed is:

1. A radiation-emitting semiconductor device comprising a semiconductor body with a semiconductor layer sequence,
   wherein the semiconductor layer sequence has an active region that generates radiation having a peak wavelength in the near-infrared spectral range and an absorption region,
   the absorption region at least partially absorbs a shortwave radiation component having a cut-off wavelength which is shorter than the peak wavelength,
   the absorption region is nominally undoped, and
   the semiconductor device has a first contact and a second contact that externally electrically contact the semiconductor device and the absorption region is arranged outside a current path extending through the active region between the first contact and the second contact.

2. A radiation-emitting semiconductor device comprising:
   a semiconductor body with a semiconductor layer sequence having an active region that generates radiation having a peak wavelength in the near-infrared spectral range and an absorption region, and the absorption region at least partially absorbs a shortwave radiation component having a cut-off wavelength shorter than the peak wavelength; and a first contact and a second contact that externally electrically contact the semiconductor device and the absorption region is arranged outside a current path extending through the active region between the first contact and the second contact.

3. The radiation-emitting semiconductor device according to claim 2, wherein the absorption region has an absorption coefficient for radiation having the cut-off wavelength of at least 5000/cm.

4. The radiation-emitting semiconductor device according to claim 2, wherein the cut-off wavelength is shorter than or equal to 820 nm.

5. The radiation-emitting semiconductor device according to claim 2, wherein the absorption region has at least one layer, the doping concentration of which is at most half a level of a doping concentration of a semiconductor material arranged between the absorption region and the active region.

6. The radiation-emitting semiconductor device according to claim 2, wherein the absorption region is nominally undoped.

7. The radiation-emitting semiconductor device according to claim 2, wherein the absorption region has at least one cutout in which a semiconductor layer arranged between the absorption region and the active region is adjacent the first contact or the second contact.

8. The radiation-emitting semiconductor device according to claim 2, wherein the active region contains $Al_xIn_yGa_{1-x-y}As$ with $0 \leq x \leq 1, 0 \leq y \leq 1$ and $x+y \leq 1$.

9. The radiation-emitting semiconductor device according to claim 2, wherein the absorption region contains $Al_xGa_{1-x}As$ with $0.01 \leq x \leq 0.1$.

10. The radiation-emitting semiconductor device according to claim 2, wherein the absorption region contains $Al_xGa_{1-x}As$ with $0.03 \leq x \leq 0.07$.

11. The radiation-emitting semiconductor device according to claim 2, wherein the absorption region has a quantum structure with at least one quantum layer.

12. The radiation-emitting semiconductor device according to claim 2, wherein the absorption region is arranged between the active region and a radiation exit face of the semiconductor body.

13. The radiation-emitting semiconductor device according to claim 2, wherein the semiconductor device is a thin-film semiconductor chip in which the semiconductor body is fastened by a materially bonded connection to a carrier and is remote from a growth substrate for the semiconductor layer sequence of the semiconductor body.

* * * * *